United States Patent
Merchant et al.

(10) Patent No.: US 6,287,970 B1
(45) Date of Patent: Sep. 11, 2001

(54) METHOD OF MAKING A SEMICONDUCTOR WITH COPPER PASSIVATING FILM

(75) Inventors: Sailesh Mansinh Merchant; Sudhanshu Misra, both of Orlando; William Michael Moller, Longwood; Pradip Kumar Roy, Orlando, all of FL (US)

(73) Assignee: Agere Systems Inc., Murray Hill, NJ (US)

( * ) Notice: Subject to any disclaimer, the term of this patent is extended or adjusted under 35 U.S.C. 154(b) by 0 days.

(21) Appl. No.: 09/370,912

(22) Filed: Aug. 6, 1999

(51) Int. Cl.[7] .................................................. H01L 21/44
(52) U.S. Cl. ........................................... 438/687; 438/638
(58) Field of Search ..................................... 438/687, 637, 438/638, 639, 640, 641, 672, 673, 674, 675

(56) References Cited

U.S. PATENT DOCUMENTS

| | | |
|---|---|---|
| 5,330,629 | 7/1994 | Cunningham et al. ......... 204/192.17 |
| 5,350,484 | 9/1994 | Gardner et al. ...................... 156/628 |
| 5,903,493 | 5/1999 | Lee ....................................... 365/149 |
| 5,915,195 | 6/1999 | Fulford, Jr. et al. ................. 438/524 |
| 6,001,414 * | 12/1999 | Huang et al. ........................... 427/96 |
| 6,046,108 * | 4/2000 | Liu et al. ............................. 438/687 |
| 6,083,835 * | 7/2000 | Shue et al. ........................... 438/687 |
| 6,093,632 * | 7/2000 | Lin ....................................... 438/618 |

* cited by examiner

Primary Examiner—David Nelms
Assistant Examiner—Dung A Le
(74) Attorney, Agent, or Firm—Allen, Dyer, Doppelt, Milbrath & Gilchrist, P.A.

(57) ABSTRACT

A method of making a semiconductor device includes the steps of forming an oxide layer adjacent a semiconductor substrate, etching trenches within the oxide layer, depositing a copper layer to at least fill the etched trenches, and forming a copper arsenate layer on the deposited copper layer. The copper arsenate layer is then chemically mechanically polished. The copper layer may be deposited by at least one of electrodeposition, electroplating and chemical vapor deposition. The copper arsenate layer on the surface of the deposited copper layer inhibits oxidation and corrosion and stabilizes the microstructure of the deposited copper layer to thereby eliminate a need to subsequently anneal the deposited copper layer.

20 Claims, 5 Drawing Sheets

METHOD OF MAKING A SEMICONDUCTOR WITH COPPER PASSIVATING FILM

FIELD OF THE INVENTION

This invention relates to the field of semiconductor manufacturing, and more particularly, to he field of passivating semiconductor interconnects.

BACKGROUND OF THE INVENTION

In the manufacture of semiconductor wafers and integrated circuits, metal films are deposited on semiconductor substrates, oxides and other dielectrics. These metal films are used for different purposes, such as forming interconnect lines, metallic contacts, conductive vias and other conductive features on and above various surfaces of the semiconductor wafers.

Typically, aluminum has been a preferred conductive metal because it avoids various problems, such as a high contact resistance with silicon, which normally accompanies the use of gold and copper. Copper also suffers drawbacks compared to aluminum because copper migrates into device areas, causing problems in device performance. Aluminum, on the other hand, has good adhesion to silicon dioxide and performs well with plasma etching, as compared to copper.

Recently, greater interest has been shown by manufacturers of semiconductor devices in the use of copper and copper alloys for metallization patterns, such as in conductive vias and interconnects. Copper, compared to aluminum, has both good electromigration resistance and a relatively low electrical resistivity of about 1.7 $\mu$ohm·cm. Unfortunately, copper is relatively quick to oxidize especially during processing or manufacturing of the integrated circuit. For example, a drawback with chemical mechanical polishing (CMP) is that copper layers and vias are prone to heavy oxidation, which can cause dishing during the chemical mechanical polishing step.

Additionally, dynamic recrystallization of electroplated copper is a potential difficulty because the microstructure continuously changes if the copper is not annealed. The changing copper microstructure can create additional problems during CMP. Conventional annealing of electroplated copper films results in the material being more ductile. Furthermore, the copper tends to lose mechanical strength and integrity during subsequent processes such as CMP, conventional passivation or inter-level dielectric (ILD) deposition. This often leads to stress-induced voiding and lack of adhesion of the copper film to underlying layers.

SUMMARY OF THE INVENTION

It is therefore an object of the present invention to provide a method of making a semiconductor device including copper while avoiding difficulties of copper oxidation and recrystallization, for example.

This and other objects, features and advantages in accordance with the present invention are provided by a method of making a semiconductor device, including the steps of: forming an oxide layer adjacent a semiconductor substrate; etching trenches within the oxide layer; depositing a copper layer to at least fill the etched trenches; and forming a copper arsenate layer on the deposited copper layer. The copper arsenate layer on the surface of the deposited copper layer inhibits oxidation and corrosion. The method may further include the step of chemically mechanically polishing the copper arsenate layer and an upper surface of the deposited copper layer.

Additionally, a second copper layer may be deposited over the oxide layer and the deposited copper layer, and a second copper arsenate layer deposited on the second deposited copper layer. The second copper arsenate layer would then preferably be chemically mechanically polished. The etch stop layer may comprise a silicon nitride layer and the copper layer may be deposited by at least one of electrodeposition, electroplating and chemical vapor deposition.

The step of forming the copper arsenate layer on the deposited copper layer stabilizes the microstructure of the deposited copper layer to thereby eliminate subsequent annealing of the deposited copper layer. Also, the step of forming the copper arsenate layer on the deposited copper layer may comprise forming the copper arsenate layer by at least one of implantation, diffusion, drive-in techniques and wet chemistry.

In another embodiment, the method of making a semiconductor device includes the steps of: forming a first oxide layer adjacent a semiconductor substrate; forming an etch stop layer over the oxide layer; forming a second oxide layer adjacent the etch stop layer and opposite the first oxide layer; etching a plurality of first openings through the second oxide layer and the etch stop layer; etching a plurality of second openings in the first oxide layer within bounds defined by the first openings; depositing a copper layer to at least fill the first and second openings; and forming a copper arsenate layer on the deposited copper layer. The copper arsenate layer on the surface of the deposited copper layer inhibits oxidation and corrosion. Again, the step of forming the copper arsenate layer on the deposited copper layer stabilizes the microstructure of the deposited copper layer to thereby eliminate subsequent annealing of the deposited copper layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
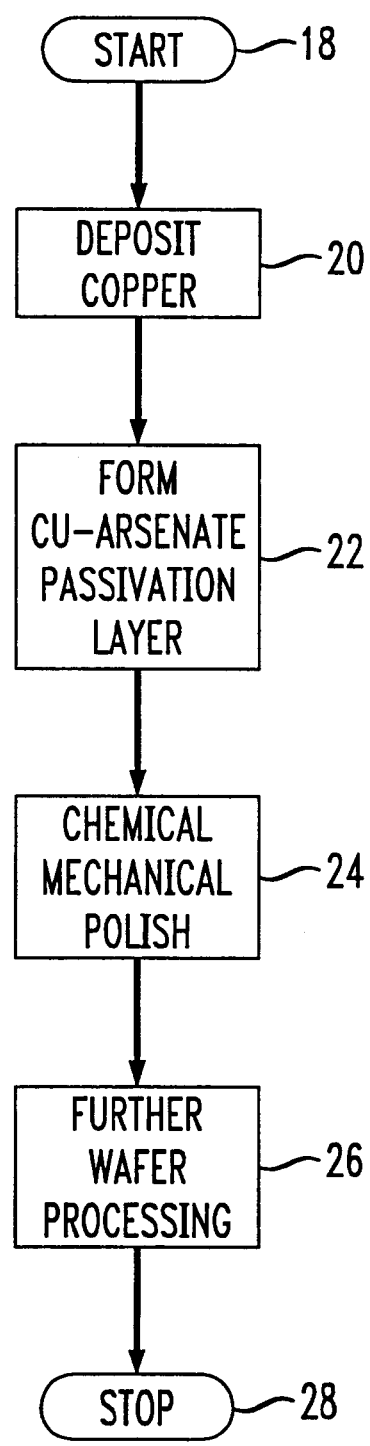
FIG. 1 is a flow chart showing the basic steps of the method of the present invention.
Figure 2:
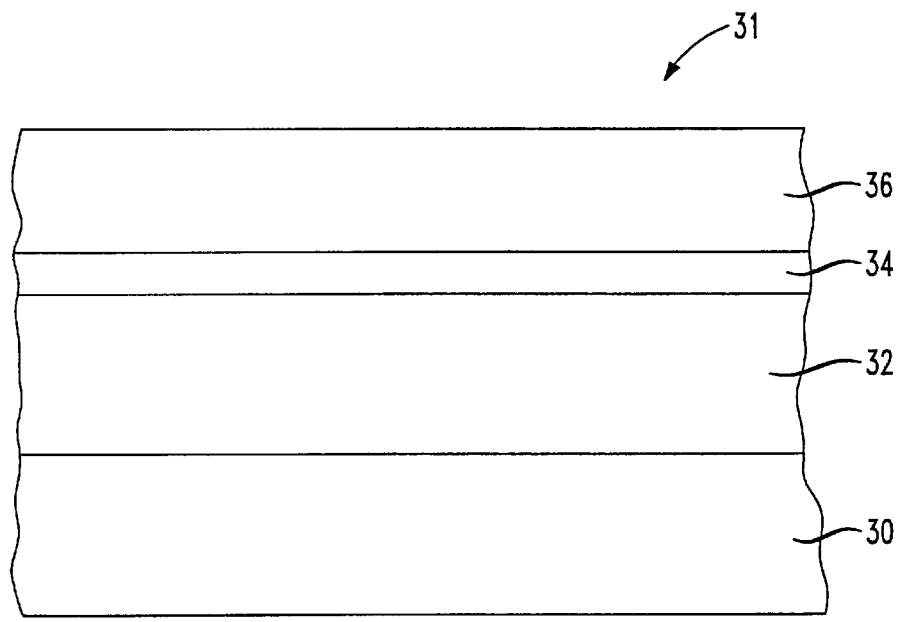
FIGS. 2–6 are cross-sectional views of a semiconductor wafer to illustrate a dual damascene process where the passivation layer is applied to a deposited copper layer in accordance with the present invention.

Referring now to the flow chart of FIG. 1, the basic steps of the present invention that forms the passivation film that protects a deposited copper layer is now described. In accordance with the present invention, the method begins (Block 18) and a copper layer is deposited by normal techniques, such as electrodeposition, electroplating or CVD (Block 20). A Cu-Arsenate passivation layer is formed over the deposited copper layer (Block 22). The semiconductor material is subjected to chemical mechanical polishing (Block 24). The wafer then is subjected to the further processing as known to those skilled in the art (Block 26) before ending the method (Block 28).

Referring now to FIGS. 2–6, a dual damascene process that is used with the present invention in forming the passivating film for copper will now be described. As shown in FIG. 1, a semiconductor substrate 30 is provided, and a first oxide layer 32 is formed adjacent the semiconductor substrate by conventional techniques. The semiconductor substrate 30 and other associated layers form a semiconductor wafer 31 as known to those skilled in the art. The first oxide layer 32 can be formed as a silicon dioxide as well as other known dielectrics, as long as the dielectric does not affect the formation of the passivation layer and the copper interconnects of the present invention.

An etch stop layer 34 is formed over the first oxide layer 32 as illustrated. The etch stop layer 34 is typically formed from silicon nitride and deposited by conventional techniques. This non-conductive silicon nitride etch stop layer 34 typically is deposited on the wafer and associated oxide layer using CVD at temperatures between about 600° C. and 900° C. A second oxide layer 36 is then formed adjacent the etch stop layer 34.

Figure 3:
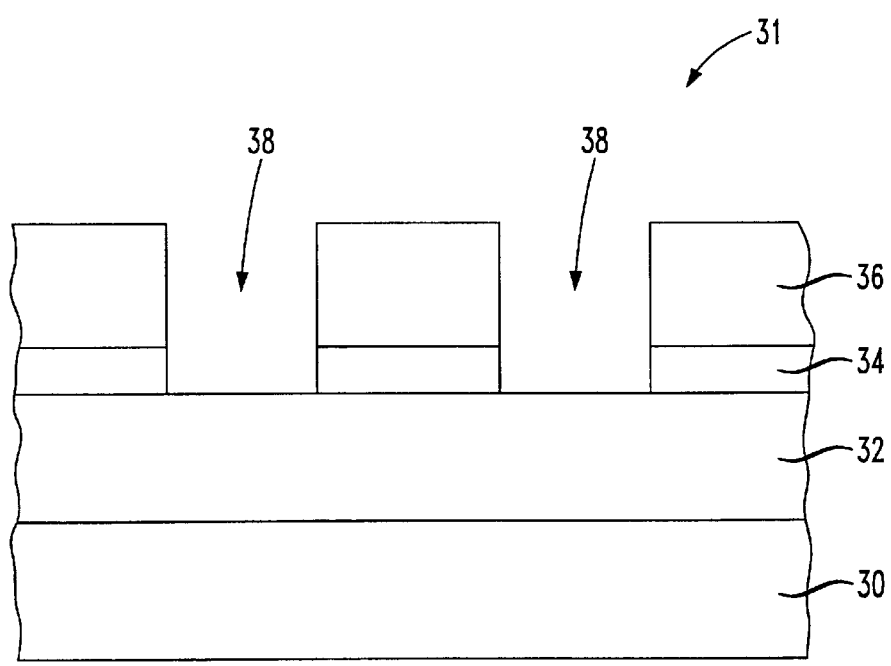

As shown in FIG. 3, a first set of openings 38 are selectively formed through the second oxide layer 36 and also through the etch stop layer 34. Although the present description proceeds with the etching of the second oxide layer 36 followed by the etching of the etch stop layer 34, other etching steps for etching the second oxide layer and the etch stop layer can be used as would readily be appreciated by those skilled in the art. The openings, e.g., trenches 38, will later be used to form metallization conductors as will be explained below.

Figure 4:
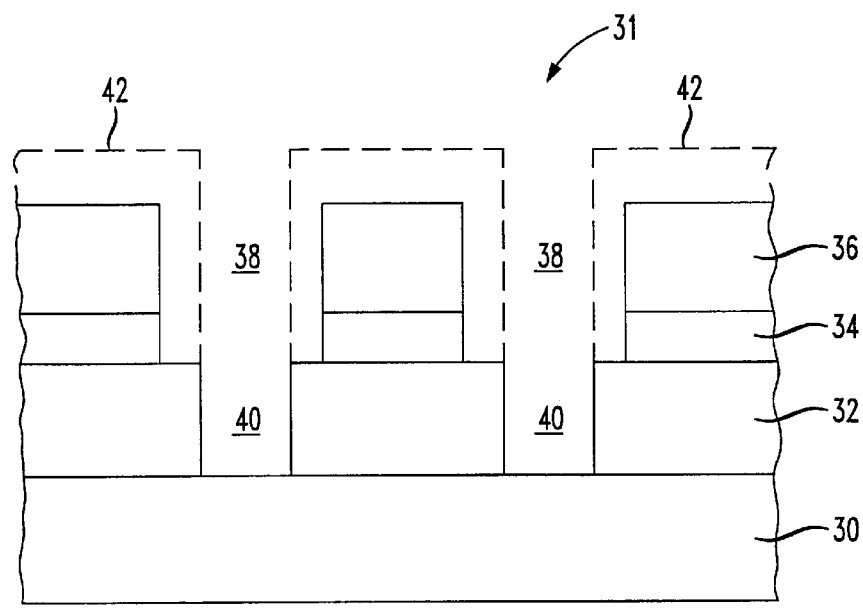

As is known in the damascene process as shown in FIG. 4, at least a second set of selected openings 40 are etched in the first oxide layer 32 within the bounds defined by each of the first set of openings 38. A photo resist shown by the dashed lines at 42 is applied to form the second set of openings 40. The photo resist is then removed by techniques known to those skilled in the art. This second set of openings 40 form the interconnects and vias between different layers, as is well known to those skilled in the art.

Figure 5:
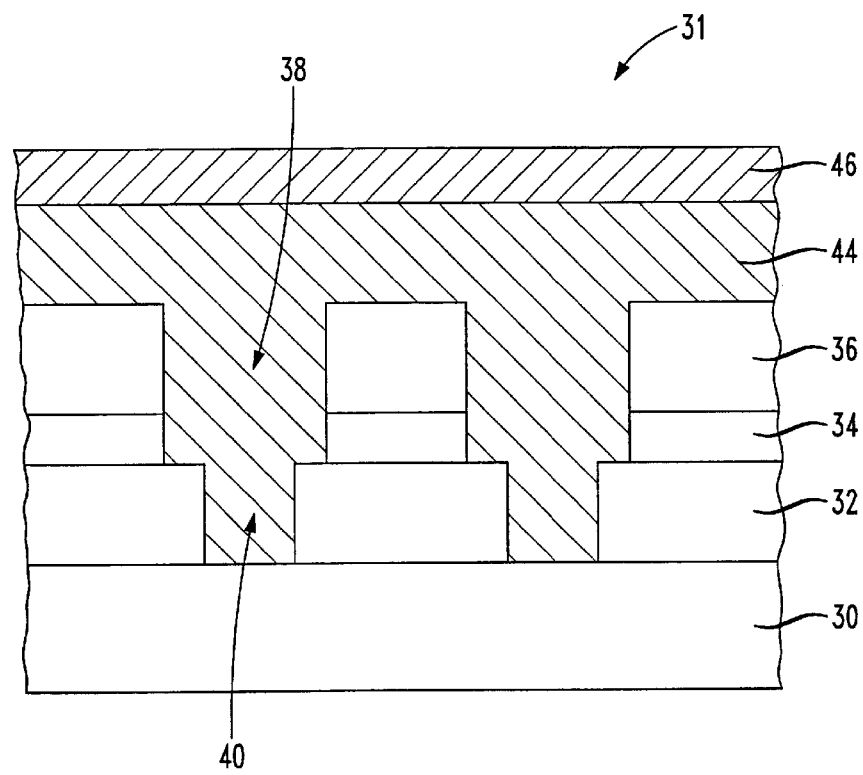

As shown in FIG. 5, a copper layer 44 is deposited at least over selected portions of the second oxide layer 36, such that the copper layer 44 is deposited within the first and second sets of openings 38, 40 and over at least portions of the second oxide layer 36 adjacent the first set of openings forming the trenches 38. As illustrated, the copper layer 44 can form a layer over the entire surface. Alternatively, only selected portions of the copper layer may be deposited. The copper layer 44 can be deposited by electrodeposition, electroplating or chemical vapor deposition techniques well known to those skilled in the art.

The thicknesses of the various layers may vary as would be appreciated by those skilled in the art. For example, the first oxide layer 32 can be deposited over the substrate by chemical vapor deposition (CVD) from a TEOS source gas and could have a thickness of about 4,000 to 6,000 angstroms or greater. The second oxide layer 36 can also be formed in a similar thickness range. The appropriate silicon nitride etch stop layer 34 can have a thickness between about 200 to 1,500 angstroms, for example. Naturally, this is only a range of thickness, which can vary depending on the thickness desired and the end use of the semiconductor devices.

A passivating film 46 is then formed on top of the deposited copper layer 44 by depositing arsenic on the deposited copper layer and forming a copper arsenate compound. The passivating film 46 deposition could be formed by passing the wafer through a heating oven and depositing the arsenic onto the deposited copper layer 44. Other techniques are possible including depositing the arsenic onto the deposited copper layer 44 in an oxygen ambient, diffusion, drive-in methods and wet chemistry. The copper arsenate compound is easily soluble in acids and ammonium hydroxide, but not soluble in water. The copper arsenate compound on the surface of the deposited copper layer 44 inhibits oxidation and corrosion. Additionally, the copper microstructure is stabilized by the presence of the arsenic on the copper layer 44.

Figure 6:
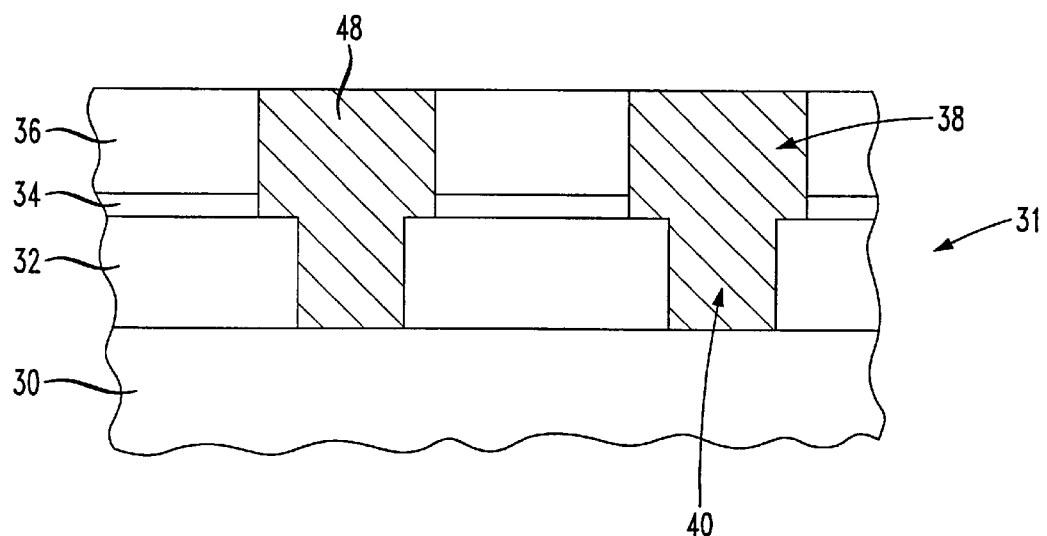
Figure 7:
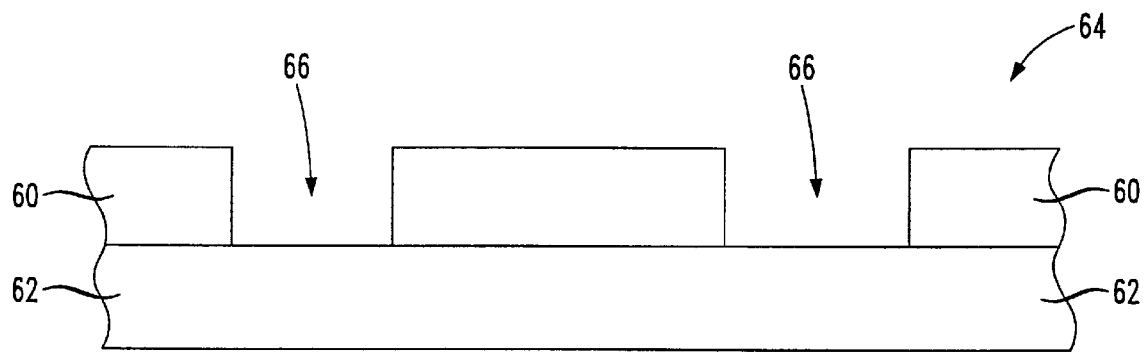
FIGS. 7–9 are cross-sectional views of a semiconductor wafer to illustrate a single damascene process where a passivation layer is applied to a deposited copper layer in accordance with the present invention.

The semiconductor wafer and associated layers are then passed to a mechanical tool for performing chemical mechanical polishing (CMP) on the wafer 31. The passivation film 46 and an upper portion of the copper layer 44 are removed during the CMP to form in-laid metallization vias 48 as illustrated in FIG. 6.

Figure 8:
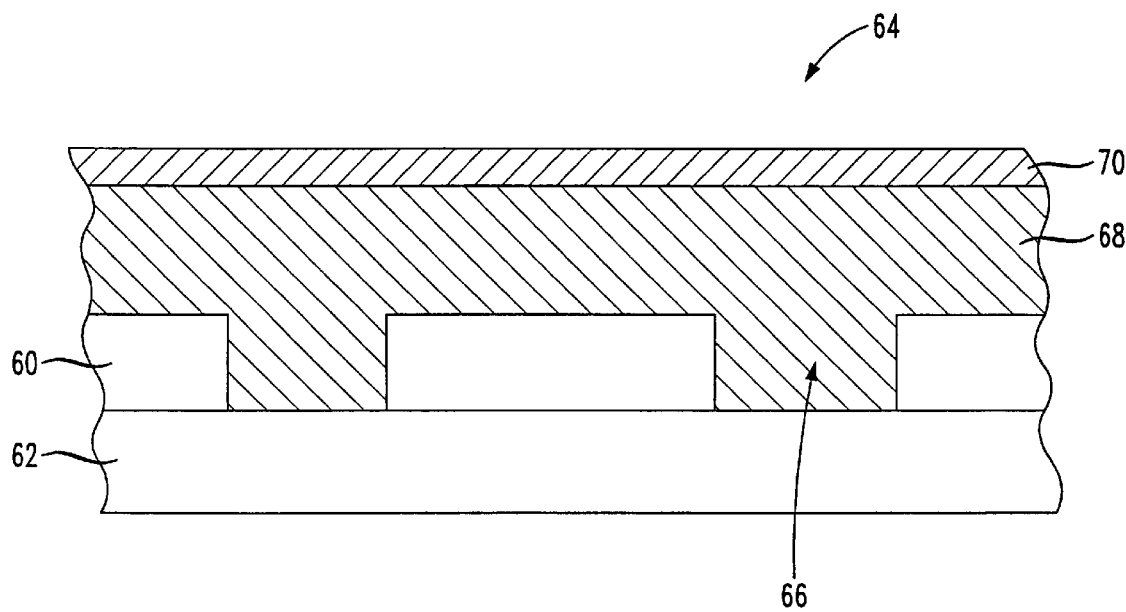
Figure 9:
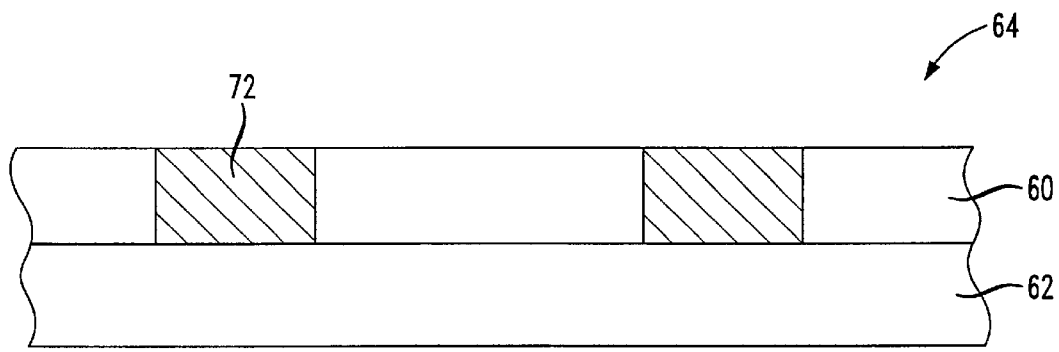

Referring now to FIGS. 7–10, a single damascene process is illustrated with the present invention, where an oxide layer 60 is deposited over a semiconductor substrate 62 forming the wafer 64. An pattern is etched as trenches 66 within the oxide layer 60. The etching is performed by techniques known to those skilled in the art. A copper layer 68 is deposited within the etched trenches 66 and over a substantial portion of the semiconductor oxide layer 60 adjacent the etched trenches (FIG. 8). The copper layer 68 could be deposited over the entire surface, and is deposited by techniques described above. In accordance with the present invention, a passivating film 70 is formed on the deposited copper layer 68 by depositing arsenic on the deposited copper layer and forming a copper arsenate composition. The passivating film 70 can be chemically mechanically polished to form metallization vias 72 as illustrated in FIG. 9. The copper arsenate compound on the surface of the deposited copper layer 68 inhibits oxidation and corrosion, and stabilizes the copper microstructure.

It is still possible to deposit a second copper layer over the oxide layer 60 and metallization vias 72. Thus, another passivating film can be formed on top of the second deposited copper layer by forming a copper arsenate. Etching can occur as explained above. Then the passivating film can be chemically mechanically polished as described and in-laid metallization conductors formed.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method of making a semiconductor device, comprising the steps of:
   forming an oxide layer adjacent a semiconductor substrate;
   etching trenches in the oxide layer;
   depositing a copper layer to at least fill the etched trenches; and
   forming a copper arsenate layer on the deposited copper layer.

2. A method according to claim 1, further comprising the step of chemically mechanically polishing the copper arsenate layer.

3. A method according to claim 1, wherein the deposited copper layer also covers an uppermost surface of the oxide layer, and further comprising the step of chemically mechanically polishing the copper arsenate layer and an upper surface of the deposited copper layer.

4. A method according to claim 3, further comprising the steps of:

depositing a second copper layer on the oxide layer and the deposited copper layer;

forming a second copper arsenate layer on the second deposited copper layer; and chemically mechanically polishing the second copper arsenate layer.

5. A method according to claim 1, wherein the step of forming the etch stop layer comprises forming a silicon nitride layer.

6. A method according to claim 1, wherein the step of depositing the copper layer comprises depositing the copper layer by at least one of electrodeposition, electroplating and chemical vapor deposition.

7. A method according to claim 1, wherein the step of forming the copper arsenate layer on the deposited copper layer stabilizes the microstructure of the deposited copper layer to thereby eliminate a need for subsequent annealing of the deposited copper layer.

8. A method according to claim 1, wherein the step of forming the copper arsenate layer on the deposited copper layer comprises forming the copper arsenate layer by at least one of implantation, diffusion, drive-in techniques and wet chemistry.

9. A method of making a semiconductor device, comprising the steps of:

forming a first oxide layer adjacent a semiconductor substrate;

forming an etch stop layer on the oxide layer;

forming a second oxide layer adjacent the etch stop layer and opposite the first oxide layer;

etching a plurality of first openings through the second oxide layer and the etch stop layer;

etching a plurality of second openings in the first oxide layer within bounds defined by the first openings;

depositing a copper layer to at least fill the first and second openings; and forming a copper arsenate layer on the deposited copper layer.

10. A method according to claim 9, further comprising the step of chemically mechanically polishing the copper arsenate layer.

11. A method according to claim 9, wherein the deposited copper layer also covers an uppermost surface of the first oxide layer, and further comprising the step of chemically mechanically polishing the copper arsenate layer and an upper surface of the deposited copper layer.

12. A method according to claim 9, wherein the step of forming the etch stop layer comprises forming a silicon nitride layer.

13. A method according to claim 9, wherein the step of depositing the copper layer comprises depositing the copper layer by at least one of electrodeposition, electroplating and chemical vapor deposition.

14. A method according to claim 9, wherein the step of forming the copper arsenate layer on the deposited copper layer stabilizes the microstructure of the deposited copper layer to thereby eliminate a need for subsequent annealing of the deposited copper layer.

15. A method according to claim 9, wherein the step of forming the copper arsenate layer on the deposited copper layer comprises forming the copper arsenate layer by at least one of implantation, diffusion, drive-in techniques and wet chemistry.

16. A method of making a semiconductor device, comprising the steps of:

depositing a copper layer in trenches of a dielectric layer adjacent a semiconductor substrate;

forming a copper arsenate layer on the deposited copper layer to thereby passivate and stabilize the microstructure of the deposited copper layer; and chemically mechanically polishing the copper arsenate layer.

17. A method according to claim 16, wherein the deposited copper layer is also deposited on an uppermost surface of the dielectric layer, and further comprising the step of chemically mechanically polishing the deposited copper layer.

18. A method according to claim 16, wherein the step of forming the etch stop layer comprises forming a silicon nitride layer.

19. A method according to claim 16, wherein the step of depositing the copper layer comprises depositing the copper layer by at least one of electrodeposition, electroplating and chemical vapor deposition.

20. A method according to claim 16, wherein the step of forming the copper arsenate layer on the deposited copper layer comprises forming the copper arsenate layer by at least one of implantation, diffusion, drive-in techniques and wet chemistry.

* * * * *